(12) United States Patent
Tu et al.

(10) Patent No.: US 9,258,030 B2
(45) Date of Patent: *Feb. 9, 2016

(54) WIRELESS COMMUNICATION DEVICE

(71) Applicant: MEDIATEK INC., Hsin-Chu (TW)

(72) Inventors: Li-Chun Tu, Hsinchu (TW); Chia-Hao Yang, Hsinchu County (TW); Tsung-Huang Chen, New Taipei (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/613,374

(22) Filed: Feb. 4, 2015

(65) Prior Publication Data

US 2015/0155905 A1    Jun. 4, 2015

Related U.S. Application Data

(63) Continuation-in-part of application No. 13/308,559, filed on Dec. 1, 2011, now Pat. No. 8,971,378.

(60) Provisional application No. 61/441,391, filed on Feb. 10, 2011.

(51) Int. Cl.
*H04B 1/00* (2006.01)
*H04B 1/40* (2015.01)
*H04B 1/3827* (2015.01)
*H04B 1/713* (2011.01)
*H04L 29/00* (2006.01)

(52) U.S. Cl.
CPC .................. *H04B 1/40* (2013.01); *H04B 1/385* (2013.01); *H04B 1/713* (2013.01); *H04L 29/00* (2013.01)

(58) Field of Classification Search
CPC ........................................................ H04L 29/00
USPC .......................................................... 375/133
See application file for complete search history.

(56) References Cited

U.S. PATENT DOCUMENTS

| 4,914,653 | A  | * | 4/1990  | Bishop et al. .................. 370/462 |
| 4,941,089 | A  | * | 7/1990  | Fischer .......................... 709/231 |
| 6,026,020 | A  | * | 2/2000  | Matsubara et al. ...... 365/185.11 |
| 8,971,378 | B2 |   | 3/2015  | Tu |
| 2003/0002534 | A1 | * | 1/2003 | Hoof .............................. 370/474 |
| 2004/0143697 | A1 |   | 7/2004 | Mahowald |
| 2005/0228276 | A1 | * | 10/2005 | He et al. ......................... 600/437 |
| 2006/0036920 | A1 | * | 2/2006 | Swaminathan ................ 714/733 |
| 2006/0189325 | A1 | * | 8/2006 | Kim et al. ................... 455/456.1 |
| 2006/0240796 | A1 |   | 10/2006 | Fron |
| 2008/0130253 | A1 |   | 6/2008 | Yamashita |

(Continued)

FOREIGN PATENT DOCUMENTS

CN          1751448 A       3/2006

*Primary Examiner* — Santiago Garcia
(74) *Attorney, Agent, or Firm* — Winston Hsu; Scott Margo

(57) ABSTRACT

A wireless communication device including an integrated processing circuit and a first memory is provided. The integrated processing circuit includes a processing unit capable of processing a wireless communication signal and a radio frequency (RF) unit capable of performing a conversion between a radio frequency (RF) signal and a baseband signal, wherein the wireless communication signal is one or more of the RF signal and the baseband signal. The first memory is coupled to the integrated processing circuit. The first memory is capable of storing data used by the processing unit, wherein the RF unit and the first memory are packaged in a single semiconductor device.

18 Claims, 12 Drawing Sheets

(56) References Cited

U.S. PATENT DOCUMENTS

| | | | |
|---|---|---|---|
| 2008/0254747 A1* | 10/2008 | Fu et al. | 455/66.1 |
| 2009/0046650 A1 | 2/2009 | Dalsgaard | |
| 2009/0070797 A1 | 3/2009 | Ramaswamy | |
| 2009/0275296 A1 | 11/2009 | Huang | |
| 2010/0040124 A1* | 2/2010 | Wurth | 375/222 |
| 2010/0144287 A1* | 6/2010 | Chen | 455/75 |

* cited by examiner

WIRELESS COMMUNICATION DEVICE

CROSS REFERENCE TO RELATED APPLICATIONS

This is a continuation-in-part of U.S. application Ser. No. 13/308,559 (filed on Dec. 1, 2011), which claims the benefit of U.S. Provisional Application No. 61/441,391 (filed on Feb. 10, 2011). The entire contents of the related applications are included herein by reference.

BACKGROUND

The present invention relates to a wireless communication device, and more particularly to a wireless communication device having an integrated processing circuit and a memory embedded in a same semiconductor package and a wireless communication device having a radio frequency unit and a memory embedded in a same semiconductor device.

In a wireless communication module, a memory package is always installed external to the baseband processing package arranged for processing a baseband operation of the wireless communication module. In this arrangement, however, a large amount of package pins are required for signal transmission between the memory package and the baseband processing package. Furthermore, a plurality of PCB (Printed circuit board) conducting paths should also be required for signal transmission between the package pins of the memory package and the baseband processing package. This interface installed between the memory package and the baseband processing package may occupy a large area on the wireless communication module that can cause difficulties when designing the modern wireless communication system. Besides, the PCB conducting paths may bring lower signal quality and limited operation speed. Therefore, how to reduce the package pin count of the wireless communication module and thus reduce using PCB conducting paths to subsequently reduce the cost is a serious problem in the field of wireless communication system.

SUMMARY

One of the objectives of the present invention is to provide a wireless communication device having an integrated processing circuit and a memory embedded in a same semiconductor package and a wireless communication device having a radio frequency unit and a memory embedded in a same semiconductor device.

According to a first embodiment of the present invention, a wireless communication device is provided. The wireless communication device comprises an integrated processing circuit and a first memory. The integrated processing circuit comprises a processing unit and a radio frequency (RF) unit. The processing unit is capable of processing a wireless communication signal. The radio frequency (RF) unit is capable of performing a conversion between a radio frequency (RF) signal and a baseband signal, wherein the wireless communication signal is one or more of the RF signal and the baseband signal. The first memory is coupled to the integrated processing circuit. The first memory is capable of storing data used by the processing unit, wherein the integrated processing circuit and the first memory are packaged in a single semiconductor package.

According to a second embodiment of the present invention, a wireless communication device is provided. The wireless communication device comprises an integrated processing circuit, a radio frequency (RF) unit, and a first memory. The integrated processing circuit comprises a processing unit, capable of processing a wireless communication signal. The radio frequency (RF) unit is capable of performing a conversion between a radio frequency (RF) signal and a baseband signal. The first memory is coupled to the integrated processing circuit, the first memory is capable of storing data used by the processing unit, wherein the wireless communication signal is one or more of the RF signal and the baseband signal, and the integrated processing circuit, the radio frequency unit, and the first memory are packaged in a single semiconductor package.

According to a third embodiment of the present invention, a wireless communication device is provided. The wireless communication device comprises an integrated processing circuit and a first memory. The integrated processing circuit comprises a processing unit and a radio frequency (RF) unit. The processing unit is capable of processing a wireless communication signal. The radio frequency (RF) unit is capable of performing a conversion between a radio frequency (RF) signal and a baseband signal, wherein the wireless communication signal is one or more of the RF signal and the baseband signal. The first memory is coupled to the integrated processing circuit. The first memory is capable of storing data used by the processing unit. The RF unit is put at one package, the first memory is put at another package, and the two packages are packaged in a single device According to a fourth embodiment of the present invention, a wireless communication device is provided. The wireless communication device comprises an integrated processing circuit, a radio frequency (RF) unit, and a first memory. The integrated processing circuit comprises a processing unit, capable of processing a wireless communication signal. The radio frequency (RF) unit is capable of performing a conversion between a radio frequency (RF) signal and a baseband signal, wherein the wireless communication signal is one or more of the RF signal and the baseband signal. The first memory is coupled to the integrated processing circuit and the first memory is capable of storing data used by the processing unit. The radio frequency (RF) unit is put at one package, the first memory is put at another package, and the two packages are packaged in a single device.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
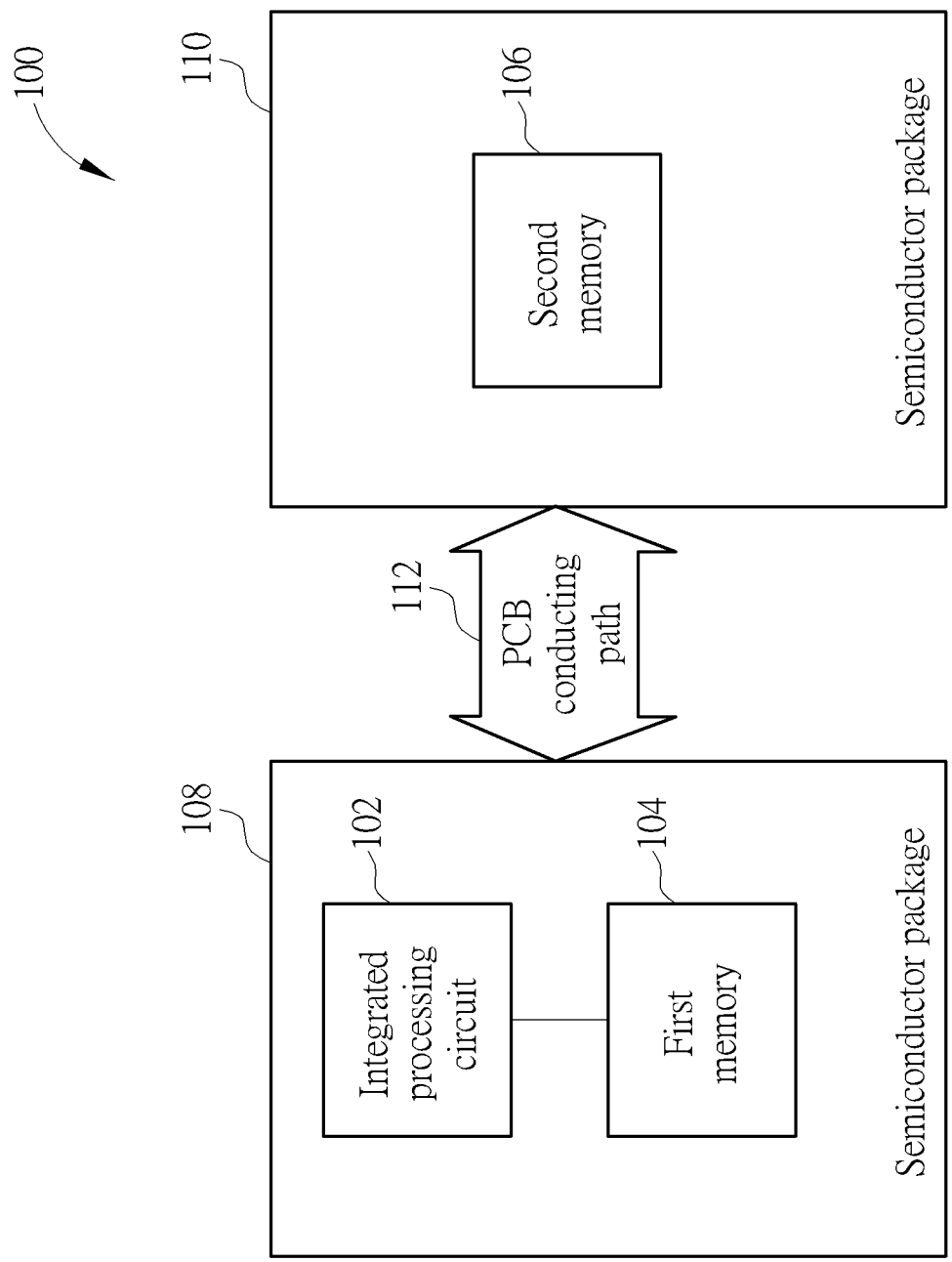
FIG. 1 is a diagram illustrating a wireless communication device according to a first embodiment of the present invention.

Please refer to FIG. 1. FIG. 1 is a diagram illustrating a wireless communication device 100 according to a first embodiment of the present invention. The wireless communication device 100 includes an integrated processing circuit 102, a first memory 104, and a second memory 106. The integrated processing circuit 102 and the first memory 104 are packaged in a single semiconductor package 108, and the second memory 106 is packaged in another semiconductor package 110. The second memory 106 can be externally coupled to the semiconductor package 108 via at least one printed circuit board (PCB) conducting path 112 or any other conducting path suitable for signal transmission between the semiconductor package 108 and the semiconductor package 110. The integrated processing circuit 102 includes a processing unit capable of processing a wireless communication signal. The first memory 104 is coupled to the integrated processing circuit 102 and is capable of storing data used by the processing unit in processing the wireless communication signal or any other signals. The second memory 106 may be a non-volatile memory (e.g., serial flash, parallel flash, etc.). In addition, the second memory 106 may be utilized to store data that is used by the processing unit. For example, when the wireless communication device 100 is powered on, the data stored in the second memory 106 may first be transferred to the first memory 104, and the processing unit then reads the data to perform the initialization process of the wireless communication device 100. Furthermore, the data of the second memory 106 may be stored in the form of compressed data. It should be noted that, in addition to processing the wireless communication signal, the processing unit may also be utilized to perform other functions of the wireless communication device 100. For example, the processing unit may be applied to execute application software, process data for a telephone directory or a to-do list of the wireless communication device 100.

In this preferred embodiment, the first memory 104, which may be a volatile memory (e.g., DRAM, pseudo SRAM, etc.) or a non-volatile memory (e.g., serial flash, parallel flash, etc.), and is conventionally placed externally to the integrated processing circuit 102, is now included in the semiconductor package 108. In other words, the integrated processing circuit 102 and the first memory 104 are arranged to be a system-in-package (SIP). Accordingly, no package pin is required for the interface between the integrated processing circuit 102 and the first memory 104. More specifically, the integrated processing circuit 102 and the first memory 104 are two dies in the same semiconductor package 108, and thus the interface between the integrated processing circuit 102 and the first memory 104 can be implemented by bonding wire(s) rather than the PCB conducting path.

Since the signal transferring between the integrated processing circuit 102 and the first memory 104 is within the semiconductor package 108, there is no need to build up package pins between the integrated processing circuit 102 and the first memory 104. Furthermore, the total number of PCB conducting paths 112 arranged to connect the semiconductor package 108 and the semiconductor package 110, thus to connect the integrated processing circuit 102 and the second memory 106, can be reduced. For example, if the second memory 106 is a serial flash memory, the SPI (Serial Peripheral Interface) bus interface can be used to connect the semiconductor package 110 with the semiconductor package 108, wherein the SPI bus interface needs only 4 to 6 pins. Therefore, the total number of pins of the semiconductor package 108 and the semiconductor package 110 is also reduced accordingly. Consequently, the size of the semiconductor package 108 including the integrated processing circuit 102 and the first memory 104 is smaller than the total size of the conventional counterpart having the integrated processing circuit and the first memory separately, and the total size of the semiconductor package 108, the PCB conducting paths 112, and the semiconductor package 110 is also smaller than the total size of the conventional counterpart having the integrated processing circuit, the first memory, and the second memory separately.

Since the integrated processing circuit 102 and the first memory 104 are packaged in the same semiconductor package 108, the signal quality (e.g., the signal eye diagram) of signal transmitting between the integrated processing circuit 102 and the first memory 104 may improve in comparison with the conventional counterpart connected by the PCB conducting paths. Moreover, in this preferred embodiment, the first memory 104 can be upgraded to have a higher operation speed for increasing the data rate transmitted between the integrated processing circuit 102 and the first memory 104 due to the absence of PCB conducting paths between the integrated processing circuit 102 and the first memory 104. It should be noted that another benefit of installing the integrated processing circuit 102 and the first memory 104 into the same semiconductor package 108 is that the driving power of the integrated processing circuit 102 and the first memory 104 can be set lower than the conventional counterpart, thus power consumption is reduced, since the loading between two dies is lower than the loading between two packages.

In this preferred embodiment, the wireless communication device 100 may further include a radio frequency (RF) unit and a power management unit (PMU). The RF unit is capable of performing a conversion between a radio frequency (RF) signal and a baseband signal, wherein the wireless communication signal processed by the integrated processing circuit 102 can be one or more of the RF signal and the baseband signal. The power management unit is capable of managing power consumption of at least one of the integrated processing circuit 102 and the first memory 104. It should be noted that the RF unit and/or the power management unit can be included in the integrated processing circuit 102, placed inside the semiconductor package 108 or external to the semiconductor package 108. For example, in one embodiment, the RF unit and/or the power management unit are/is installed within the integrated processing circuit 102. In another embodiment, the RF unit and/or the power management unit are/is installed within the semiconductor package 108 but not within the integrated processing circuit 102. In another embodiment, the RF unit and/or the power management unit are/is placed externally to the semiconductor package 108.

Figure 2:
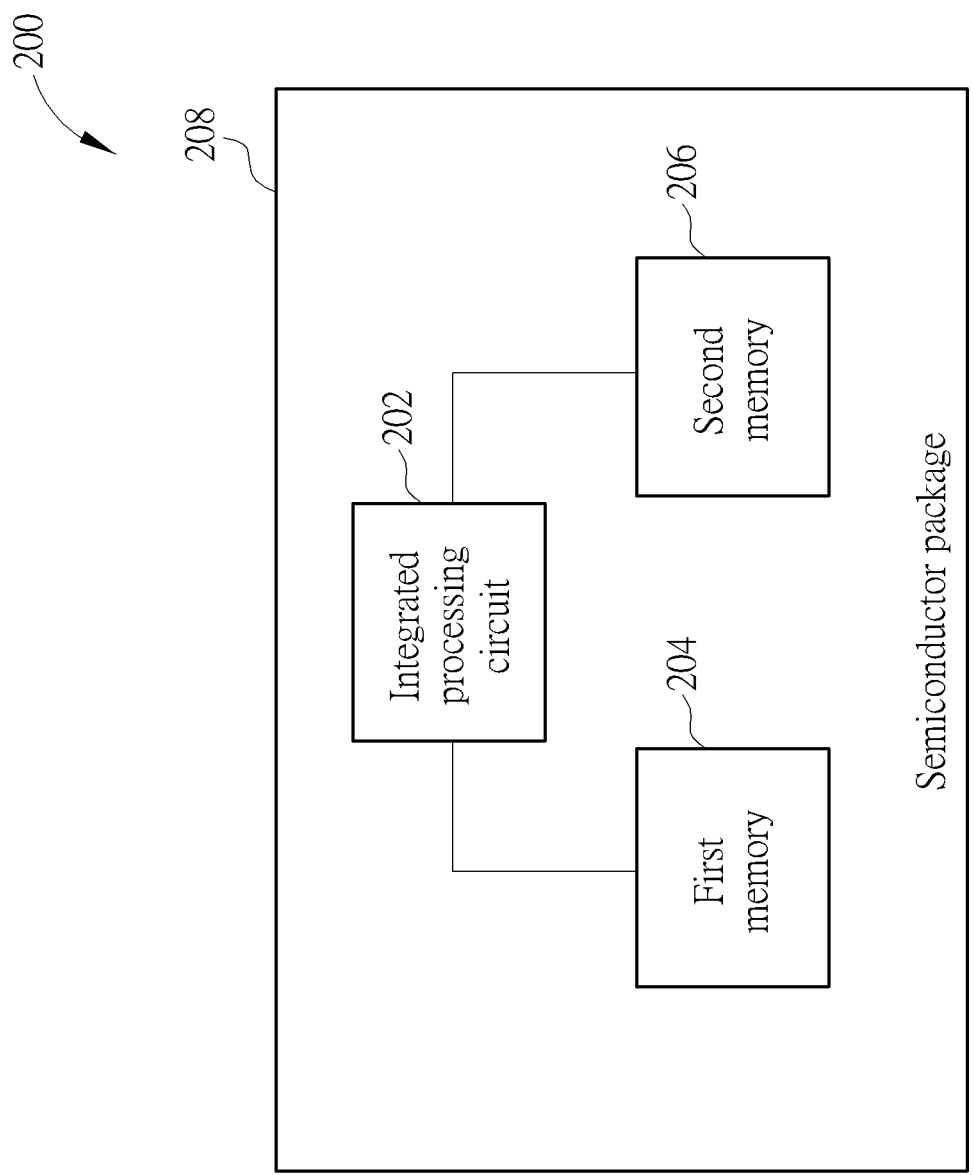
FIG. 2 is a diagram illustrating a wireless communication device according to a second embodiment of the present invention.

Please refer to FIG. 2. FIG. 2 is a diagram illustrating a wireless communication device 200 according to a second embodiment of the present invention. The wireless communication device 200 includes an integrated processing circuit 202, a first memory 204, and a second memory 206. Compared to the above-mentioned first embodiment, the integrated processing circuit 202, the first memory 204, and the second memory 206 are all packaged in a single semiconductor package 208. The integrated processing circuit 202 includes a processing unit capable of processing a wireless communication signal. The first memory 204 is coupled to the integrated processing circuit 202 and capable of storing data used by the processing unit in processing the wireless communication signal or any other signals. The second memory 206 is coupled to the integrated processing circuit 202. In addition, the second memory 206 may be utilized to store data that is used by the processing unit. For example, when the wireless communication device 200 is powered on, the data stored in the second memory 206 may first be transferred to the first memory 204, and the processing unit then reads the data to perform the initialization process of the wireless communication device 200. Furthermore, the data of the second memory 206 may be stored in the form of compressed data. It should be noted that, in addition to processing the wireless communication signal, the processing unit may also be utilized to perform other functions of the wireless communication device 200. For example, the processing unit may be applied to execute application software, process data for a telephone directory or a to-do list of the wireless communication device 200.

In this preferred embodiment, the first memory 204 and the second memory 206, which may be a volatile memory (e.g., DRAM, pseudo SRAM, etc.) and a non-volatile memory (e.g., serial flash, parallel flash, etc.) respectively, and conventionally would be placed externally to the integrated processing circuit 202, are now included in the semiconductor package 208. The first memory 204 can also be a non-volatile memory (e.g., serial flash, parallel flash, etc.). In other words, the integrated processing circuit 202, the first memory 204, and the second memory 206 are arranged to be a system-in-package (SIP). Accordingly, no package pin is required for the interface between the integrated processing circuit 202 and the first memory 204, and the interface between the integrated processing circuit 202 and the second memory 206. More specifically, the integrated processing circuit 202, the first memory 204, and the second memory 206 are three dies in same the semiconductor package 208, thus the interfaces between the integrated processing circuit 202 and the first memory 204, and between the integrated processing circuit 202 and the second memory 206 can be implemented by bonding wire(s) rather than the PCB conducting path.

Since the signal transferring between the integrated processing circuit 202 and the first and second integrated memories 204, 206 is within the semiconductor package 208, there is no need to build up package pins between the integrated processing circuit 202 and the first and second integrated memories 204, 206. Therefore, the total number of pins of the semiconductor package 208 is reduced. Consequently, the size of the semiconductor package 208 including the integrated processing circuit 202 and the first and second integrated memories 204, 206 is smaller than the total size of the conventional counterpart having the integrated processing circuit and the first and second integrated memories separately.

Similar to the above-mentioned embodiment, the signal quality (e.g., the signal eye diagram) of signal transmitting between the integrated processing circuit 202 and the first and second integrated memories 204, 206 may become better in comparison with the conventional counterpart connected by the PCB conducting paths. The first and second integrated memories 204, 206 can be upgraded to have higher operation speeds to increase the data rate transmitted between the integrated processing circuit 202 and the first and second integrated memories 204, 206 due to the absence of PCB conducting paths between the integrated processing circuit 202 and the first and second integrated memories 204, 206. In addition, the driving power of the integrated processing circuit 202 and the first and second integrated memories 204, 206 can be set to be lower than the conventional counterpart.

The wireless communication device 200 may further include a RF unit and a power management unit. The arrangement of the RF unit and the power management unit can be similar to those arrangements illustrated for the wireless communication device 100, thus a detailed description is omitted here for brevity.

Figure 3:
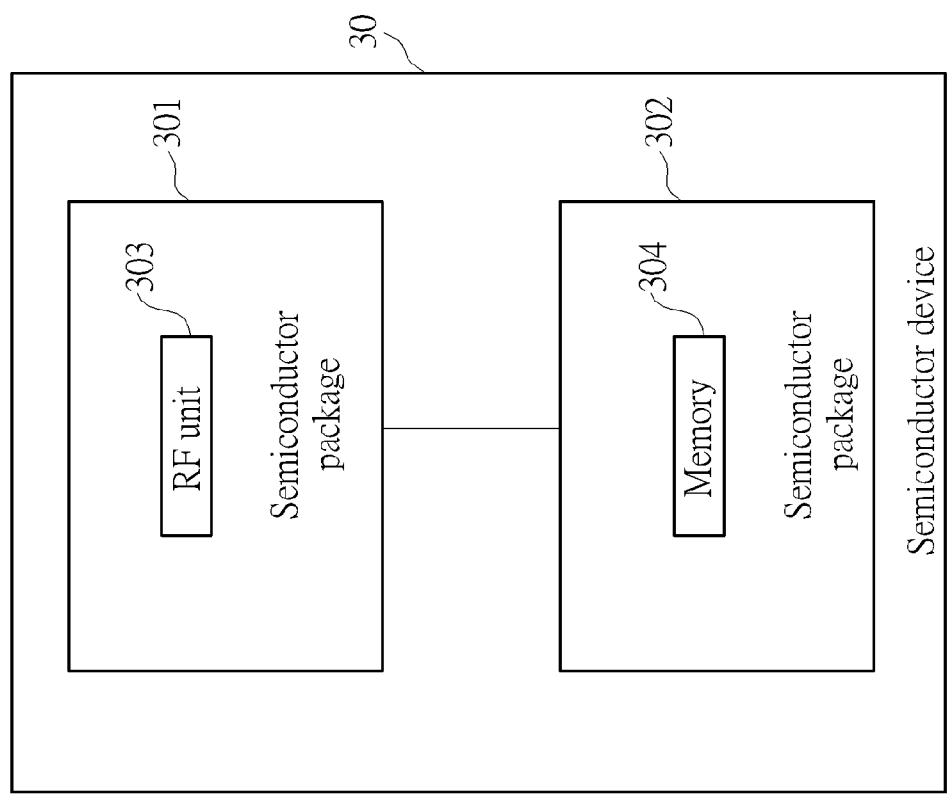
FIG. 3 is a diagram illustrating a semiconductor device according to an embodiment of the present invention.

Regarding the embodiment shown in FIG. 1, the integrated processing circuit 102 and the first memory 104 may be two dies packaged in the same semiconductor package 108. However, this is for illustrative purposes only, and is not meant to be a limitation of the present invention. FIG. 3 is a diagram illustrating a semiconductor device according to an embodiment of the present invention. The semiconductor device 30 may include a plurality of semiconductor packages 301 and 302, where an RF unit 303 may be put at one semiconductor package 301, and a memory 304 may be put at another semiconductor package 302. By way of example, but not limitation, multiple semiconductor packages (e.g., 301 and 302) may be packaged in a single device (e.g., semiconductor device 30) by using a two-dimensional (2D) packaging manner or a three-dimensional (3D) packaging manner. For example, package stacking technology, such as Package-on-Package (PoP) or Package-in-Package (PiP), may be employed to package the semiconductor packages 301 and 302 in the semiconductor device 30. It should be noted that the present invention has no limitations on the packaging method actually used for integrating multiple semiconductor packages in a single device. That is, a single device with one semiconductor package having an RF unit included therein and another semiconductor package having a memory included therein falls within the scope of the present invention.

Figure 4:
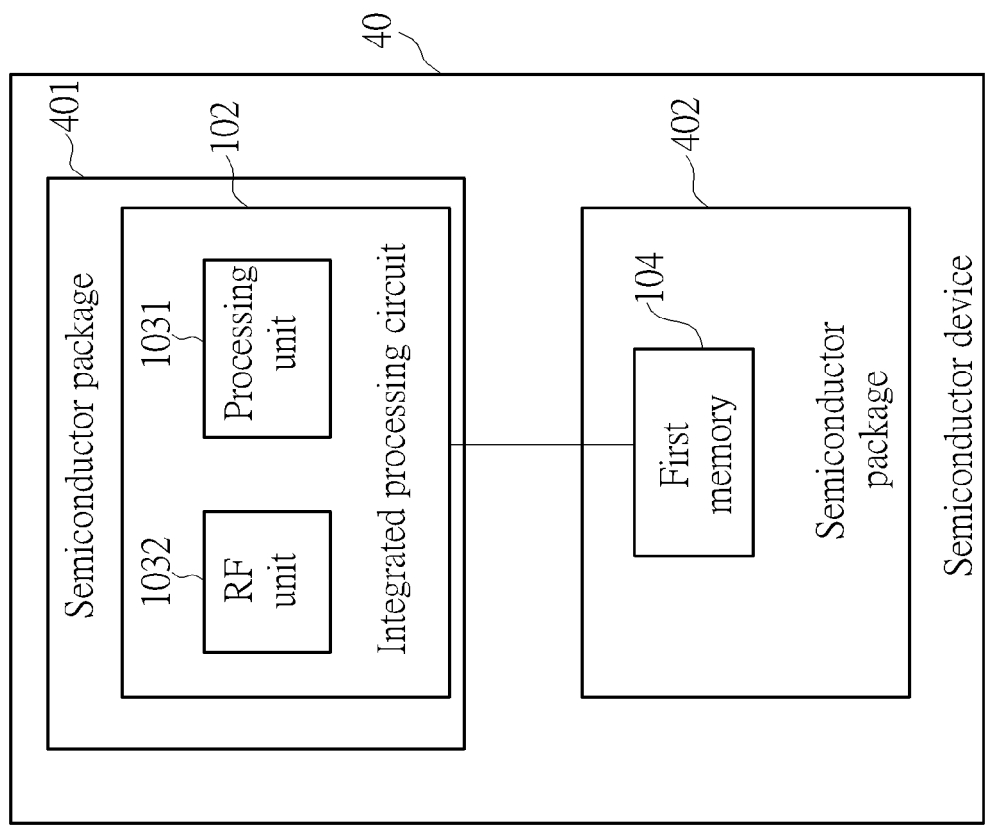
FIG. 4 is a diagram illustrating a first alternative integration design of the integrated processing circuit and the first memory shown in FIG. 1 according to an embodiment of the present invention.
Figure 5:
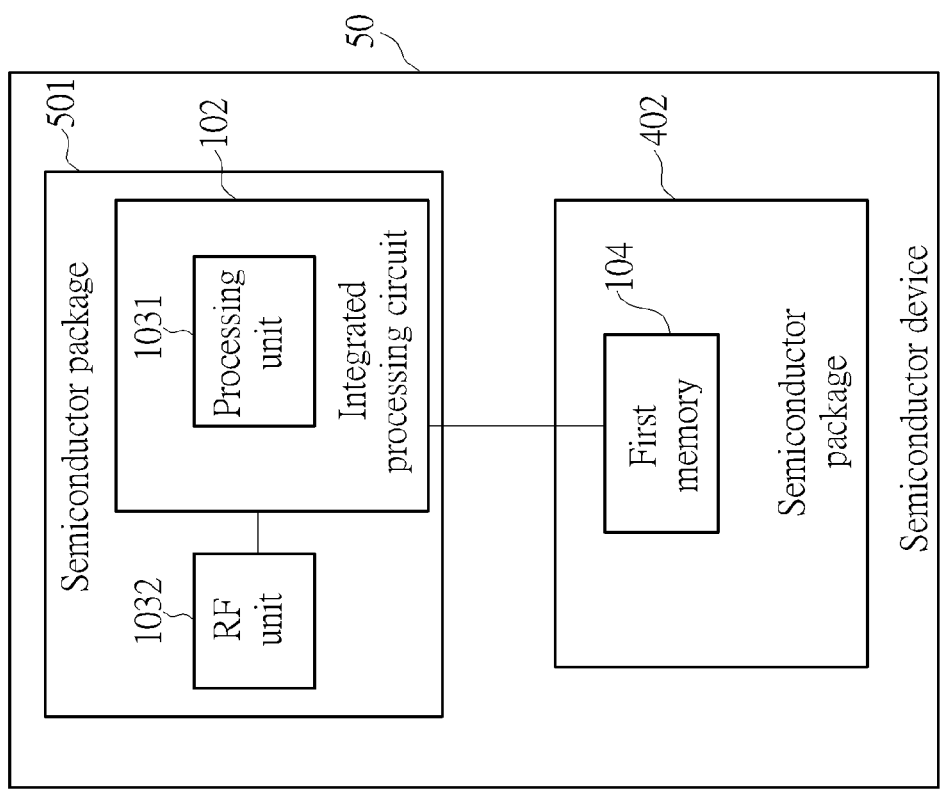
FIG. 5 is a diagram illustrating a second alternative integration design of the integrated processing circuit and the first memory shown in FIG. 1 according to an embodiment of the present invention.

In accordance with the proposed semiconductor device design shown in FIG. 3, the present invention further proposes alterations of the semiconductor package 108 shown in FIG. 1. FIG. 4 is a diagram illustrating a first alternative integration design of the integrated processing circuit 102 and the first memory 104 shown in FIG. 1 according to an embodiment of the present invention. FIG. 5 is a diagram illustrating a second alternative integration design of the integrated processing circuit 102 and the first memory 104 shown in FIG. 1 according to an embodiment of the present invention. A wireless communication device (e.g., 100) may be modified to have a semiconductor package (e.g., 108) replaced by the semiconductor device 40 or the semiconductor device 50, depending upon actual design consideration. The major difference between the semiconductor devices 40 and 50 is the location of an RF unit 1032. The RF unit 1032 may be configured to perform a conversion between an RF signal and a baseband signal. The processing unit 1031 may be configured to process a wireless communication signal, where the wireless communication signal may be one or more of the RF signal and the baseband signal. Regarding the embodiment shown in FIG. 4, the RF unit 1032 and the processing unit 1031 may be both included in the integrated processing circuit 102, the integrated processing circuit 102 may be put at the semiconductor package 401, and the first memory 104 may be put at another semiconductor package 402. Regarding the embodiment shown in FIG. 5, the RF unit 1032 may be external to the integrated processing circuit 102, the integrated processing circuit 102 and the RF unit 1032 may be put at the semiconductor package 501, and the first memory 104 may be put at another semiconductor package 402.

In the embodiments shown in FIG. 4 and FIG. 5, the RF unit 1032 and the processing unit 1031 may be put at the same semiconductor package 401/501. However, this is for illustrative purposes only, and is not meant to be a limitation of the present invention. Alternatively, the processing unit 1031 may be configured to be placed outside the semiconductor package 401 in which the RF unit 1032 is located. To put it simply, any integration design of the integrated processing circuit 102 and the first memory 104 that employs the proposed semiconductor device design shown in FIG. 3 falls within the scope of the present invention.

In the above-mentioned embodiments, two issues may emerge from installing the memory (e.g., the first memory 104 and/or the second memory 206) into the semiconductor package/semiconductor device including the integrated processing circuit. The first issue can be how to determine if the memory installed into the semiconductor package/semiconductor device is an effective memory. The second issue can be how to reduce the interference caused by the memory when the memory is installed into the semiconductor package/semiconductor device.

Figure 6:
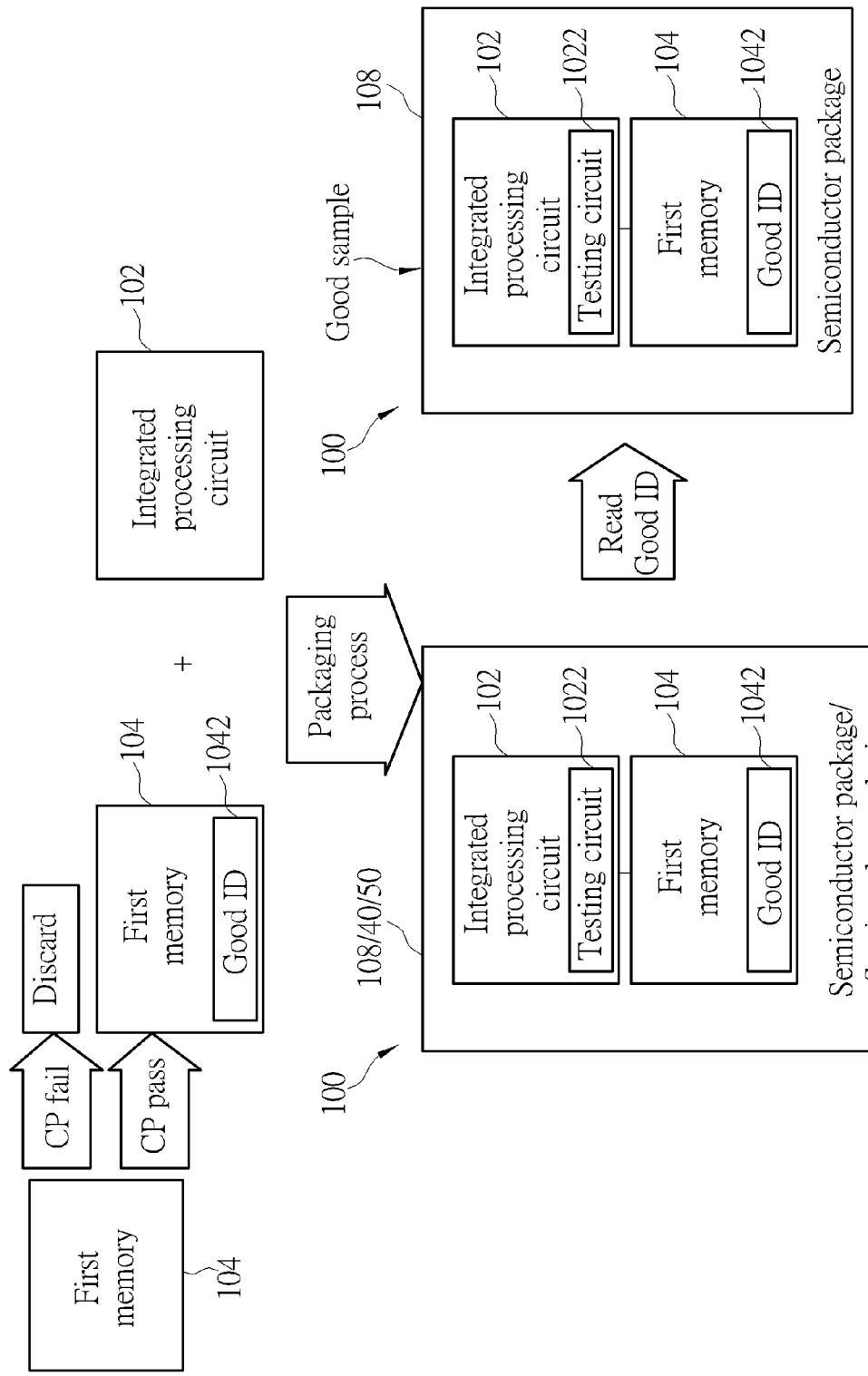
FIG. 6 is a diagram illustrating a flowchart showing a method of determining if a memory installed into a semiconductor package is an effective memory.

Regarding the first issue, please refer to FIG. 6, which is a flowchart illustrating how to determine if the memory installed into the semiconductor package/semiconductor device is an effective memory. For the example of the wireless communication device 100, before the first memory 104 is ready to be installed in the semiconductor package 108 (or semiconductor device 40/50), a testing procedure (e.g., a chip probe, CP) may be performed by such as the manufacturer of the first memory or the wireless communication device 100 to determine if the first memory 104 is an effective memory. When the first memory 104 fails the testing procedure, the first memory 104 can be discarded. When the first memory 104 passes the testing procedure, the first memory 104 can be signed or marked by an identification, wherein the identification is capable of indicating that the first memory 104 is an effective memory. In other words, the identification can be regarded as a good ID for the first memory 104 as shown in FIG. 6.

When the first memory 104 is identified as an effective memory, the first memory 104 can then be included into the semiconductor package 108 (or semiconductor device 40/50) with the integrated processing circuit 102 via a packaging process to form at least a portion of the wireless communication device 100. When the packaging process is completed, another test may be performed upon the semiconductor package 108 (or semiconductor device 40/50). At this stage, a tester (not shown) may be utilized for reading the identification (i.e., the good ID 1042) of the first memory 104, wherein the tester may externally couple to the semiconductor package 108 (or semiconductor device 40/50). When the tester determines that the good ID 1042 exists in the first memory 104, at least the first memory 104 can be confirmed not the discarded memory. In other words, utilizing the tester to test the existence of good ID 1042 can help confirm that the first memory 104 packaged in the semiconductor package 108 (or semiconductor device 40/50) is an effective memory.

Another method to check whether the first memory 104 packaged in the semiconductor package 108 (or semiconductor device 40/50) is effective is testing the function of the first memory 104 by a testing circuit 1022 to see if the first memory 104 functions well. It should be noted that, in some embodiments, the testing circuit 1022 can be embedded in the integrated processing circuit 102 as shown in FIG. 6. More specifically, the testing circuit 1022 can be a built-in self-test (BIST) circuit embedded in the integrated processing circuit 102. Accordingly, the above-mentioned first issue can be solved.

It should be noted that the purpose of signing or marking the good ID 1042 is to exclude the failed memory from the semiconductor package 108 (or semiconductor device 40/50), and installing the testing circuit 1022 into the semiconductor package 108 (or semiconductor device 40/50) is to check whether the first memory 104 is an effective memory. Furthermore, both the good ID 1042 and the testing circuit 1022, or only one of the good ID 1042 and the testing circuit 1022, can be applied to the semiconductor package 108 (or semiconductor device 40/50). In the embodiment that both the good ID 1042 and the testing circuit 1022 are applied, when the good ID 1042 does not work, or when the good ID 1042 is wrong, the testing circuit 1022 can be utilized to test the effectivity of the first memory 104.

Figure 7:
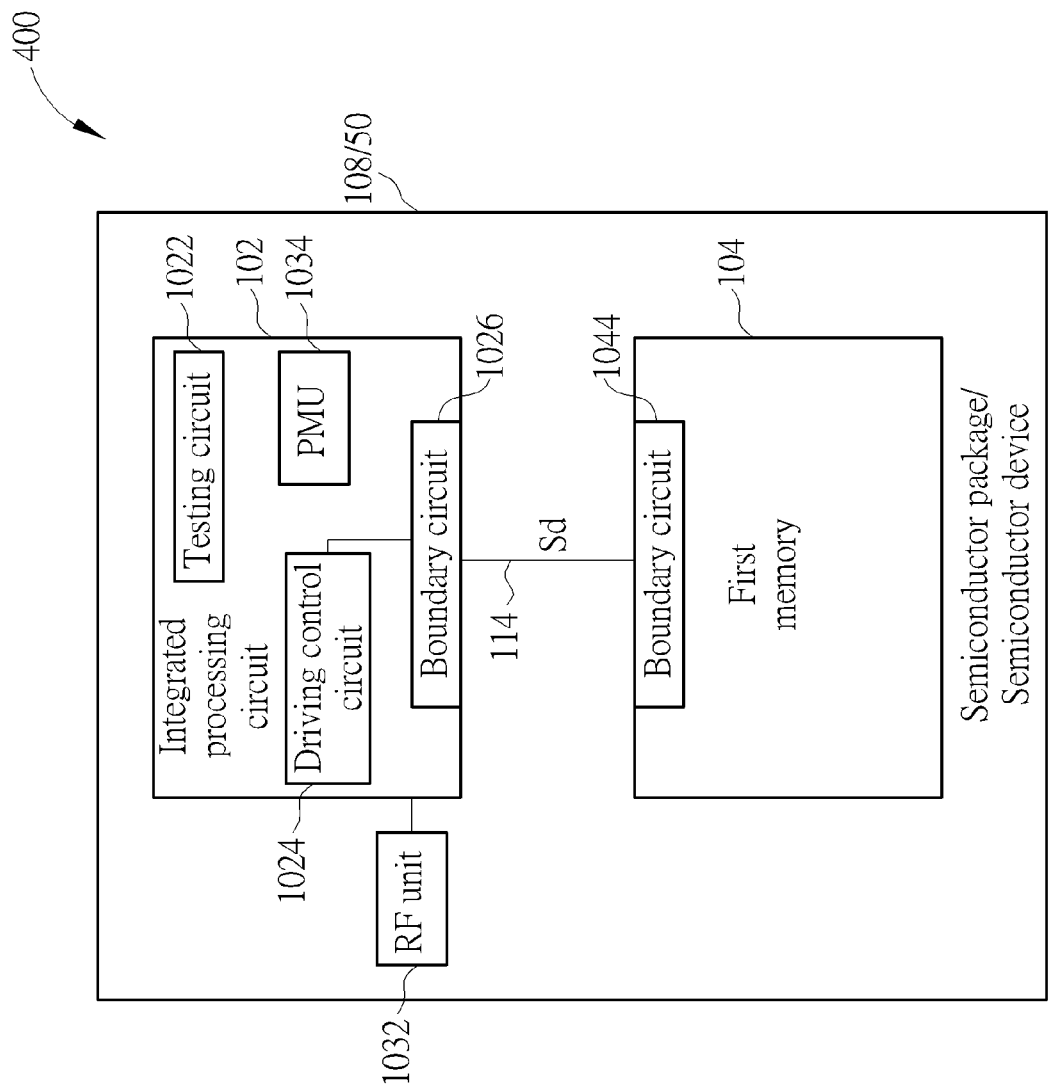
FIG. 7 is a diagram illustrating a wireless communication device utilizing a first method to reduce the interference caused by a first memory according to the embodiment of the present invention.

Regarding the second issue, which is how to reduce the interference caused by the first memory 104 when the first memory 104 is installed into the semiconductor package 108 (or semiconductor device 40/50), at least three methods are developed to solve this. The first method is to adjust, such as lower, the driving power of a driving signal transmitted between the first memory 104 and the integrated processing circuit 102. In one embodiment, the driving power can be adjusted to a minimum driving power acceptable for transmitting the driving signal between the first memory 104 and the integrated processing circuit 102 to make the memory read/write operation performed under the minimum driving power. FIG. 7 is a diagram illustrating the wireless communication device 400 utilizing the first method to reduce the interference caused by the first memory 104 according to the embodiment of the present invention. In this embodiment, a driving control circuit 1024 and a boundary circuit 1026 can be further included in the integrated processing circuit 102, and a boundary circuit 1044 can be further included in the first memory 104, wherein at least one bonding wire 114 is capable of connecting the boundary circuit 1026 and the boundary circuit 1044. The driving control circuit 1024 is capable of adjusting a driving power of a driving signal Sd generated by the boundary circuit 1026 and/or the boundary circuit 1044. In one embodiment, the driving control circuit 1024 is capable of adjusting the driving power to a minimum driving power acceptable for transmitting the driving signal Sd between the first memory 104 and the integrated processing circuit 102. When the driving signal Sd transmitted between the first memory 104 and the integrated processing circuit 102 is decreased, the interference caused by the first memory 104 can be reduced. Accordingly, this arrangement is capable of reducing the interference made to the sensitive circuit(s) such as RF unit 1032 of the wireless communication device 400. More specifically, in the wireless communication device 400, the sensitive circuit may be utilized to process an analog signal that is more sensitive than the digital circuit. For example, the RF unit 1032 is utilized to perform the conversion between a radio frequency (RF) signal and a baseband signal of the wireless communication device 400. In this embodiment, the RF unit 1032 is externally coupled (i.e., different die, or different package, or same package) to the integrated processing circuit 102, however the RF unit 1032 and the integrated processing circuit 102 are installed in the same package (or the same device).

The wireless communication device 400 further comprises a power management unit (PMU) 1034. The power management unit 1034 is capable of managing power consumption of the integrated processing circuit 102 and/or the first memory 104. In this embodiment, the PMU 1034 is internally coupled to the integrated processing circuit 102. In other words, the PMU 1034 and the integrated processing circuit 102 are installed in the same die, however this is not the limitation of the present invention.

It should be noted that, in FIG. 7, though only the testing circuit 1022 is applied, a good ID can also be applied in the first memory 104 by using the above-mentioned method. Therefore, both the good ID and the testing circuit 1022, or only one of the good ID and the testing circuit 1022, can be applied to the semiconductor package 108 (or semiconductor device 50).

Figure 8:
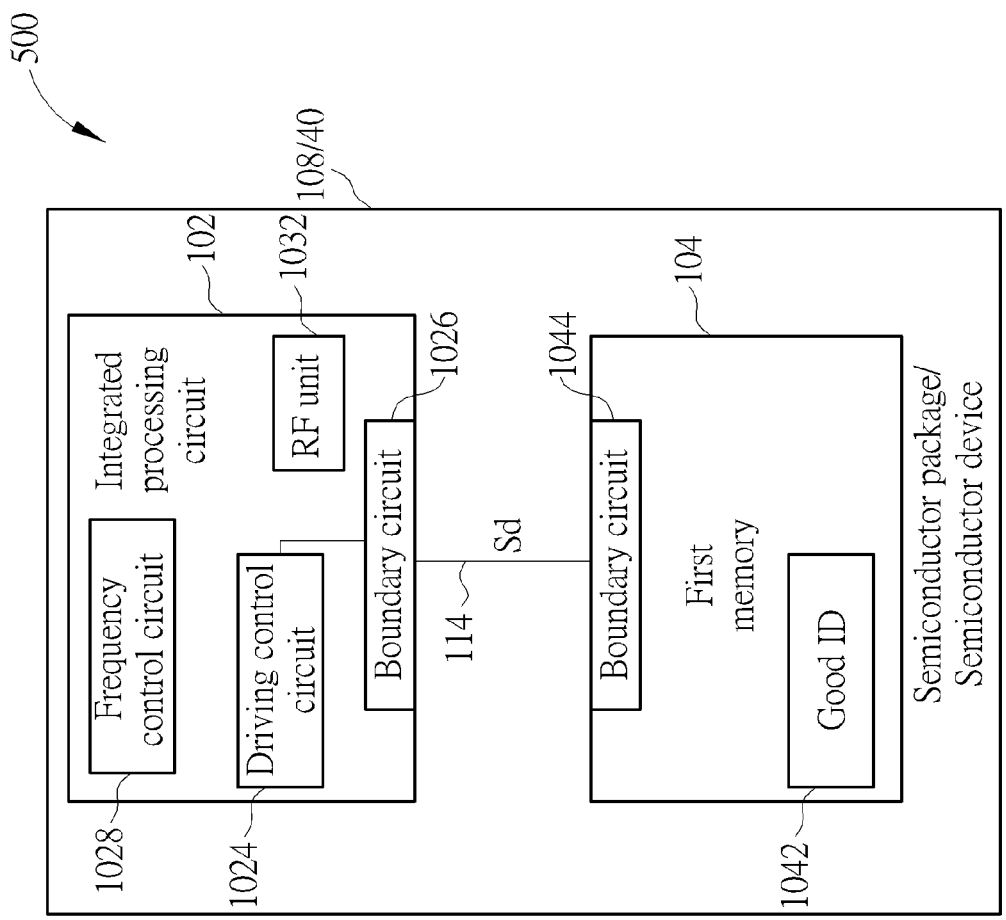
FIG. 8 is a diagram illustrating a wireless communication device utilizing a second method to reduce the interference caused by a first memory according to the embodiment of the present invention.
Figure 9:
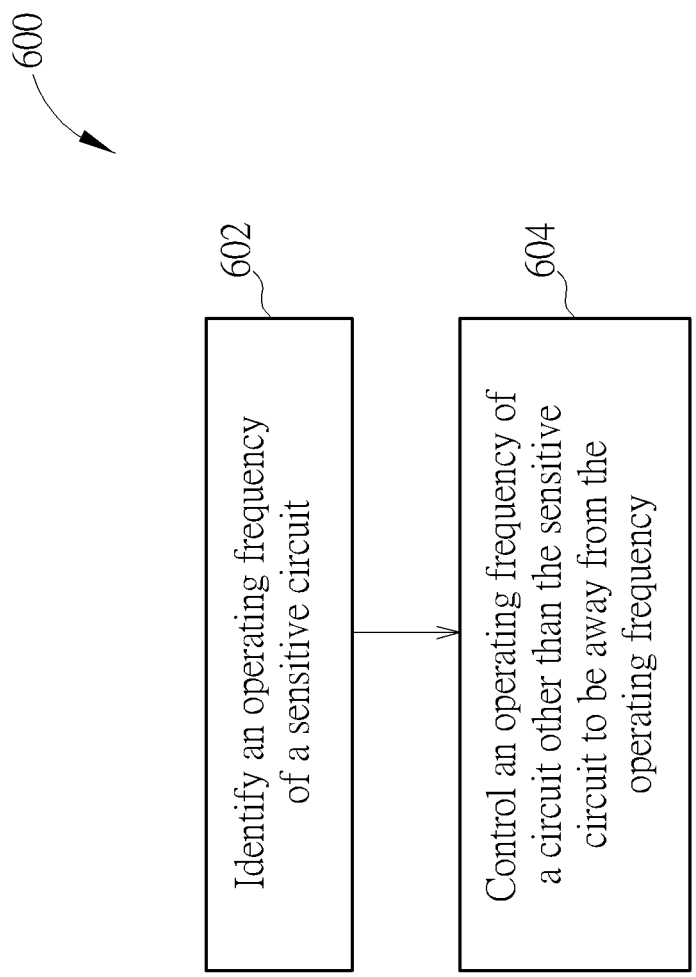
FIG. 9 is a flowchart illustrating a frequency hopping control method performed by a frequency control circuit according to an embodiment of the present invention.

The second method is using a frequency hopping scheme to avoid the operating frequency band of sensitive circuit(s) such as the RF unit 1032 as shown in FIG. 8. FIG. 8 is a diagram illustrating a wireless communication device 500 utilizing the second method to reduce the interference caused by the first memory 104 according to the embodiment of the present invention. In this embodiment, a frequency control circuit 1028 can be further included in the integrated processing circuit 102. The frequency control circuit 1028 is capable of controlling an operating frequency of component(s) other than sensitive circuit(s) to be different from the operating frequency band of the sensitive circuit(s). One example of the component(s) other than sensitive circuit(s) is the first memory 104. One example of the sensitive circuit(s) is the RF unit 1032. In this embodiment, the frequency control circuit 1028 can be a frequency hopping control circuit. Please refer to FIG. 9. FIG. 9 is a flowchart illustrating a frequency hopping control method 600 performed by the frequency control circuit 1028 according to an embodiment of the present invention. Provided that substantially the same result is achieved, the steps of the flowchart shown in FIG. 9 need not be in the exact order shown and need not be contiguous, that is, other steps can be intermediate. Besides, step 602 can be omitted. The frequency hopping control method 600 can include the steps of:

Step 602: Identify an operating frequency F1 of the sensitive circuit, e.g., the RF unit 1032; and Step 604: Control an operating frequency of the circuit (e.g. the first memory 104) other than the sensitive circuit to be away from the operating frequency F1.

Figure 10:
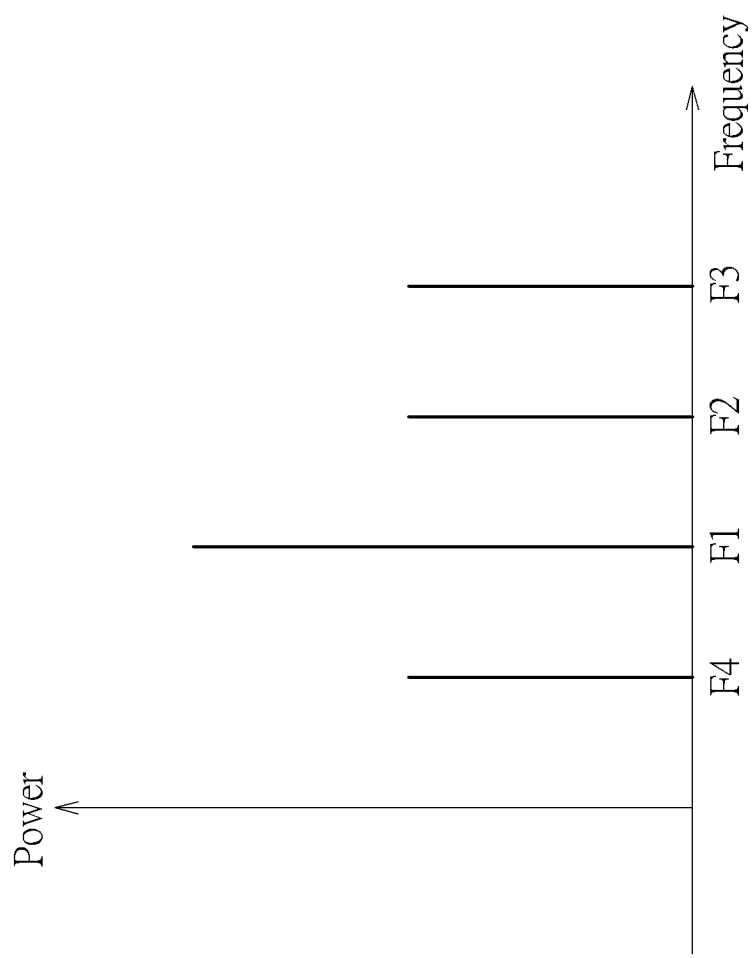
FIG. 10 is a spectrum diagram illustrating an operating frequency of a radio frequency (RF) signal and various operating frequencies of a first memory according to an embodiment of the present invention.

In step 602, the frequency control circuit 1028 can identify the operating frequency F1 of the sensitive circuit. More specifically, when/before the wireless communication device 500 receives an RF signal having an oscillating frequency F1, the frequency control circuit 1028 is capable of determining the oscillating frequency (i.e., F1) of the RF signal. In step 604, when the RF unit 1032 processes the RF signal, the frequency control circuit 1028 is capable of controlling the operating frequency F2 of the first memory 104 to be different from the oscillating frequency (i.e., F1) of RF signal. The operating frequency of the first memory 104 can be controlled by the frequency control circuit 1028 to hop to various frequencies to avoid the oscillating frequency F1 when the oscillating frequency F1 is changed as shown in FIG. 10. FIG. 10 is a spectrum diagram illustrating the oscillating frequency F1 of the RF signal and various operating frequencies (i.e., F2, F3, F4) of the first memory 104 according to an embodiment of the present invention. When the oscillating frequency F1 of the RF signal varies, the operating frequency of the first memory 104 can vary as well to be away from the oscillating frequency F1. Since the operating frequency F1 of the sensitive circuit is now different from the operating frequency F2 of the first memory 104, the interference made to the power and signal of the integrated processing circuit 102 can be reduced. More specifically, in the wireless communication device 500, the sensitive circuit may be utilized to process an analog signal that is more sensitive than the digital circuit. For example, the RF unit 1032 can be utilized to perform the conversion between a radio frequency (RF) signal and a baseband signal of the wireless communication device 500. In the wireless communication device 500, the RF unit 1032 is internally coupled (i.e., same die, or same package, or different package) to the integrated processing circuit 102.

It should be noted that, in FIG. 8, though only the good ID 1042 is applied, a testing circuit can also be installed in the semiconductor package 108 (or semiconductor device 40) by using the above-mentioned method. Therefore, both the good ID 1042 and the testing circuit, or only one of the good ID 1042 and the testing circuit, can be applied to the semiconductor package 108 (or semiconductor device 40).

Figure 11:
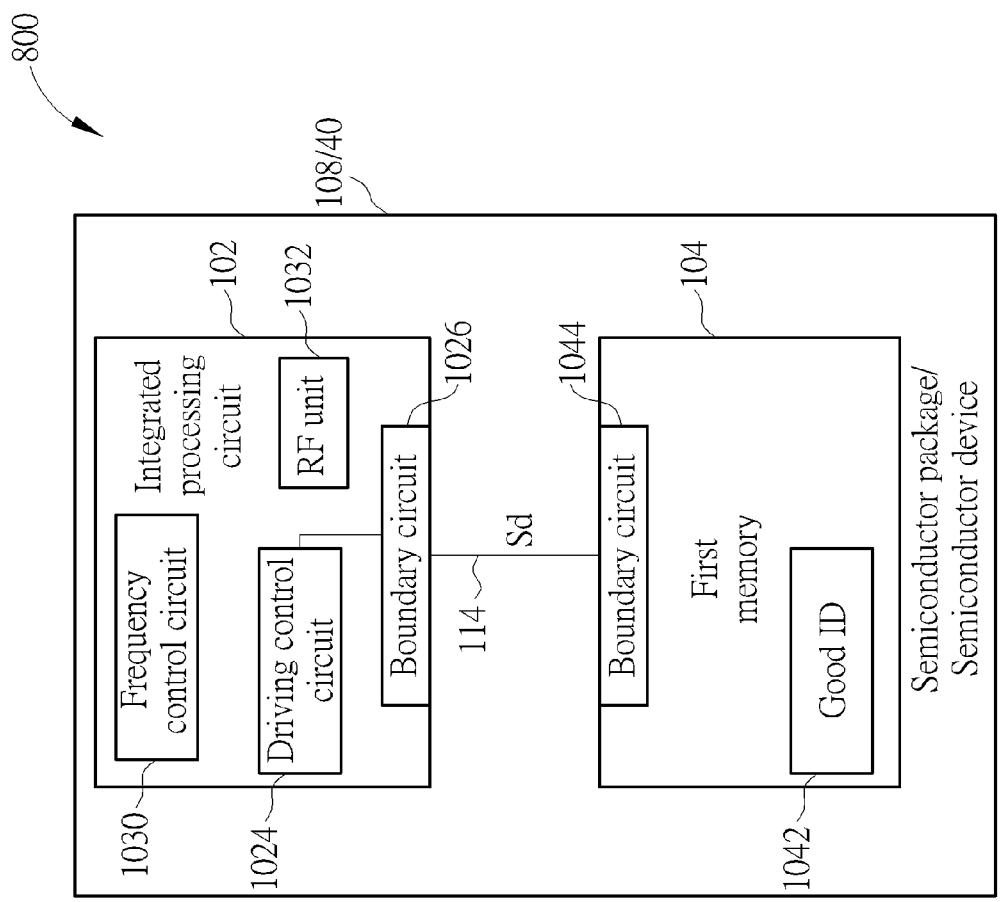
FIG. 11 is a diagram illustrating a wireless communication device utilizing a third method to reduce the interference caused by a first memory according to the embodiment of the present invention.
Figure 12:
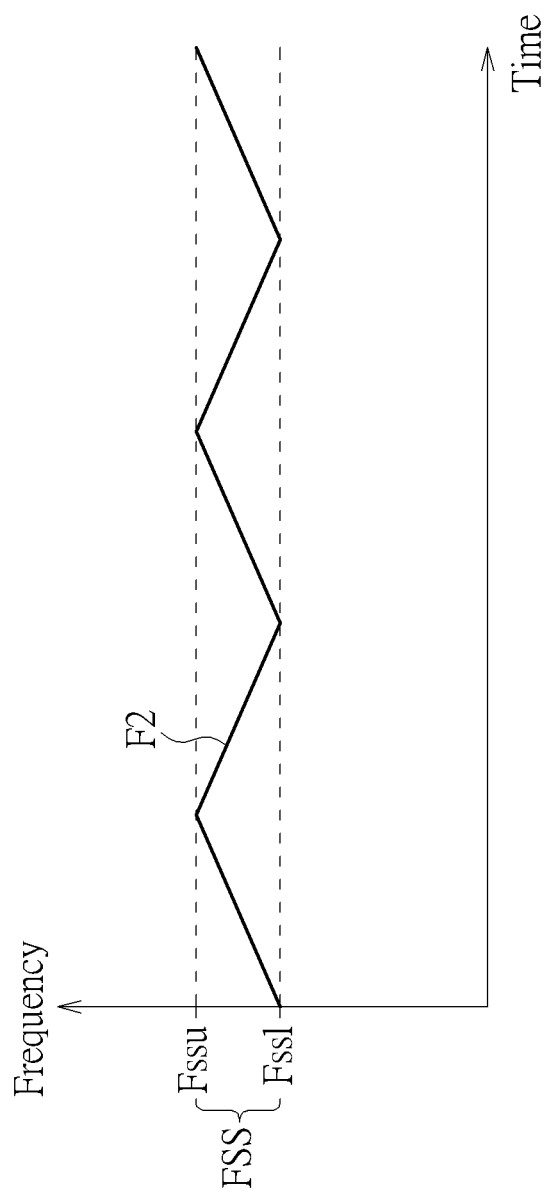
FIG. 12 is a timing diagram illustrating an operating frequency of a first memory according to an embodiment of the present invention.

The third method is using a spread spectrum scheme to reduce radiation power from at least one circuit other than the sensitive circuit (e.g. RF unit 1032) as shown in FIG. 11. FIG. 11 is a diagram illustrating the wireless communication device 800 utilizing the third method to reduce the interference caused by the first memory 104 according to the embodiment of the present invention. In this embodiment, a frequency control circuit 1030 can be further included in the integrated processing circuit 102. The frequency control circuit 1030 is capable of spreading an operating frequency of component(s) other than sensitive circuit(s) into a specific frequency band Fss as shown in FIG. 12. One example of the component(s) other than sensitive circuit(s) is the first memory 104. One example of the sensitive circuit(s) is the RF unit 1032. FIG. 12 is a timing diagram illustrating the operating frequency of the first memory 104 according to an embodiment of the present invention. It should be noted that, for brevity, the operating frequency of the first memory 104 in this preferred embodiment is also marked as F2. Furthermore, in this embodiment, the frequency control circuit 1030 can be a spread spectrum control circuit. When the RF unit 1032 processes a received RF signal for example, the frequency control circuit 1030 can slowly adjust the operating frequency F2 of the first memory 104 to change from the lower bound frequency Fssl to the upper bound frequency Fssu of the specific frequency band Fss as shown in FIG. 12. By doing this, the energy of the operating frequency F2 of the first memory 104 is averagely distributed into the specific frequency band Fss, therefore the interference caused by the operating frequency F2 of the first memory 104 made to the power and signal of the integrated processing circuit 102 can be reduced.

In addition, trying to physically place the first memory 104 away from the sensitive circuit (e.g. RF unit 1032) also helps reduce the interference caused by first memory 104 to the sensitive circuit. More specifically, in the wireless communication device 800, the sensitive circuit may be utilized to process an analog signal that is more sensitive than the digital circuit. For example, the RF unit 1032 is utilized to perform the conversion between a radio frequency (RF) signal and a baseband signal of the wireless communication device 800. In the wireless communication device 800, the RF unit 1032 is internally coupled (i.e., same die) to the integrated processing circuit 102.

Furthermore, in FIG. 11, though only the good ID 1042 is applied, a testing circuit can also be installed in the semiconductor package 108 (or semiconductor device 40) by using the above-mentioned method. Therefore, both the good ID 1042 and the testing circuit, or only one of the good ID 1042 and the testing circuit, can be applied to the semiconductor package 108 (or semiconductor device 40).

It should be noted that, even though the above-mentioned methods utilized for solving the issue of how to determine if the memory installed into the semiconductor package (or semiconductor device) is an effective memory and the issue of how to reduce the interference caused by the memory are described in conjunction with the wireless communication device 100, 400, 500 and 800, those skilled in the art will appreciate that the above-mentioned methods may also be applied to the wireless communication device 200 or any other wireless communication devices having RF unit and memory in the same package (or semiconductor device) for solving similar issues. Examples of wireless communication device may include, but not limited to, mobile phone, tablet and wearable device. Furthermore, the present invention is not limited to using all the above-mentioned methods together in the wireless communication device 100, 400, 500 and 800. Applying one or more of the above-mentioned methods in the wireless communication device 100, 200, 400, 500, 800 or any other wireless communication devices having integrated processing circuit and memory in the same package (or having the RF unit and memory in the same device) also belongs to the scope of the present invention. Moreover, the arrangement of the above-mentioned good IDs, testing circuits, driving control circuits, frequency control circuits, RF units, first memories, second memories, and PMUs are not limited to the arrangement shown in FIGS. 1-8 and 11. Those skilled in the art will appreciate that the arrangement may also be re-arranged/modified according to the practical designing requirement of the wireless communication device. Besides, in FIG. 8 and FIG. 11, though the frequency control circuits 1028, 1030, the driving control circuit 1024, and the RF unit 1032 are installed in the integrated processing circuit 102, the frequency control circuits 1028, 1030, the driving control circuit 1024, and/or the RF unit 1032 may be arranged to externally couple to integrated processing circuit 102 and still in the same semiconductor package 108 (or semiconductor device 40/50), or be selectively omitted. The frequency control circuits 1028, 1030, the driving control circuit 1024, and/or the RF unit 1032 may also be arranged to externally couple to the semiconductor package 108 (or semiconductor device 40/50).

Briefly, the present invention includes at least one memory into the semiconductor package (or semiconductor device) having an integrated processing circuit for processing the wireless communication signal to reduce the cost of the wireless communication device and improve signal quality and operation speed. Furthermore, the present invention also discloses at least three methods to solve the issue of how to determine if the memory installed into the semiconductor package (or semiconductor device) is an effective memory, and the issue of how to reduce the interference caused by the memory when the memory is installed into the semiconductor package (or semiconductor device).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wireless communication device, comprising:
    an integrated processing circuit, comprising:
        a processing unit, capable of processing a wireless communication signal; and
        a radio frequency (RF) unit, capable of performing a conversion between a radio frequency (RF) signal and a baseband signal, wherein the wireless communication signal is one or more of the RF signal and the baseband signal; and
    a first memory, coupled to the integrated processing circuit, the first memory capable of storing data used by the processing unit, wherein the first memory comprises an identification, capable of indicating that the first memory is a non-discarded memory; and
    a testing circuit, coupled to the first memory, the testing circuit capable of testing the first memory for determining if the first memory is a non-discarded memory;
    wherein the RF unit is put at a first package, the first memory is put at a second package, and the first package and the second package are packaged in a single device.

2. The wireless communication device of claim 1, wherein the integrated processing circuit further comprises:
    a driving control circuit, capable of adjusting a driving power of a driving signal transmitted between the first memory and the integrated processing circuit.

3. The wireless communication device of claim 2, wherein the driving power is adjusted to a minimum driving power acceptable for transmitting the driving signal between the first memory and the integrated processing circuit.

4. The wireless communication device of claim 1, wherein the integrated processing circuit further comprises:
    a frequency control circuit, capable of controlling an operating frequency of the first memory to be different from an oscillating frequency of the radio frequency (RF) signal.

5. The wireless communication device of claim 4, wherein the frequency control circuit is a frequency hopping control circuit.

6. The wireless communication device of claim 1, wherein the integrated processing circuit further comprises:
    a frequency control circuit, capable of spreading an operating frequency of the first memory into a specific frequency band.

7. The wireless communication device of claim 6, wherein the frequency control circuit is a spread spectrum control circuit.

8. The wireless communication device of claim 1, wherein the integrated processing circuit further comprises:
- a power management unit (PMU), capable of managing power consumption of at least one of the integrated processing circuit and the first memory.

9. The wireless communication device of claim 1, further comprising:
- a power management unit (PMU), capable of managing power consumption of at least one of the integrated processing circuit and the first memory;
- wherein the power management unit, the RF unit, and the first memory are packaged in the single device.

10. The wireless communication device of claim 1, further comprising:
- a second memory, externally coupled to the single device.

11. The wireless communication device of claim 10, wherein the first memory is a volatile memory, and the second memory is a non-volatile memory.

12. The wireless communication device of claim 1, wherein the wireless communication device is a wearable device.

13. A wireless communication device, comprising:
- an integrated processing circuit, comprising a processing unit, capable of processing a wireless communication signal;
- a radio frequency (RF) unit, capable of performing a conversion between a radio frequency (RF) signal and a baseband signal; and
- a first memory, coupled to the integrated processing circuit, the first memory capable of storing data used by the processing unit, wherein the first memory comprises an identification, capable of indicating that the first memory is a non-discarded memory; and
- a testing circuit, coupled to the first memory, the testing circuit capable of testing the first memory for determining if the first memory is a non-discarded memory;
- wherein the wireless communication signal is one or more of the RF signal and the baseband signal, the RF unit is put at a first package, the first memory is put at a second package, and the first package and the second package are packaged in a single device.

14. The wireless communication device of claim 13, wherein the integrated processing circuit further comprises:
- a frequency control circuit, capable of controlling an operating frequency of the first memory to be different from an oscillating frequency of the radio frequency (RF) signal.

15. The wireless communication device of claim 13, wherein the integrated processing circuit further comprises:
- a frequency control circuit, capable of spreading an operating frequency of the first memory into a specific frequency band.

16. The wireless communication device of claim 13, wherein the integrated processing circuit further comprises:
- a driving control circuit, capable of adjusting a driving power of a driving signal transmitted between the first memory and the integrated processing circuit.

17. The wireless communication device of claim 16, wherein the driving power is adjusted to a minimum driving power acceptable for transmitting the driving signal between the first memory and the integrated processing circuit.

18. The wireless communication device of claim 13, wherein the wireless communication device is a wearable device.

* * * * *